United States Patent [19]

Nakada

[11] Patent Number: 4,601,361
[45] Date of Patent: Jul. 22, 1986

[54] STRUCTURE FOR MOUNTING LOUDSPEAKER ON ELECTRONIC MUSICAL INSTRUMENT

[75] Inventor: Akira Nakada, Shizuoka, Japan

[73] Assignee: Nippon Gakki Seizo Kabushiki Kaisha, Tokyo, Japan

[21] Appl. No.: 676,178

[22] Filed: Nov. 29, 1984

[30] Foreign Application Priority Data

Jan. 26, 1984 [JP] Japan .................................. 59-8252[U]

[51] Int. Cl.⁴ ........................... H05K 5/00; G10H 1/00
[52] U.S. Cl. ..................................... 181/141; 181/144; 181/172; 84/1.01; 84/DIG. 17
[58] Field of Search ............... 181/141, 150, 151, 153, 181/144–148, 172; 84/1.01, DIG. 17

[56] References Cited

U.S. PATENT DOCUMENTS

| | | | |
|---|---|---|---|
| 2,789,158 | 4/1957 | Livingston | 181/153 X |
| 2,952,179 | 9/1960 | Andersen | 181/141 X |
| 4,312,258 | 1/1982 | Park | 181/151 X |

*Primary Examiner*—Benjamin R. Fuller
*Attorney, Agent, or Firm*—Blakely Sokoloff Taylor & Zafman

[57] ABSTRACT

On an electronic musical instrument, a loudspeaker is fitted to a space through a bellows. Therefore, it can be freely pulled out and push into the space. Further, the use of the bellows contribute to making the space smaller and an acoustic effect easily changeable.

8 Claims, 7 Drawing Figures

STRUCTURE FOR MOUNTING LOUDSPEAKER ON ELECTRONIC MUSICAL INSTRUMENT

BACKGROUND OF THE INVENTION

This invention relates to a structure for mounting a loudspeaker on an electronic musical instrument capable of freely adjusting the angle, adjusting the angle to vary the acoustic effect, and reducing the space necessary to accommodate the loudspeaker.

Various electronic musical instruments such as an electronic keyboard musical instrument, music synthesizer or the like are classified into two types, one containing the loudspeaker in the body of the musical instrument and the other in which the loudspeaker is separated from the body of the musical instrument.

Although the former enables compact the musical instrument, the sounds are confined in the instrument thereby degrading the sound quality or attenuating the sounds. When the sound volume is increased, the circuit board etc. vibrates thereby producing parastic vibration. Moreover, as high pitch tones propagate straightly, there is a limit to a position of which the loudspeaker can be mounted, thus decreasing the freedom of design.

The applicant has proposed an improved design for permitting the loudspeaker to be pulled out and pushed in for obviating this problem as disclosed in Japanese Preliminary Patent Publication No. 44888/1983. For example, a window is formed on the upper surface of the casing of an electronic musical instrument, and one end of a loudspeaker box having a sector shaped cross-section is hinged to one edge of the window so as to swing the box, whereby the loudspeaker box is pulled out or pushed into the casing.

With the method of mounting the loudspeaker, however, since the loudspeaker box is made to appear and disappear from the main body of the musical instrument a large space is necessary for the loudspeaker box, thus making it impossible to make small the musical instrument. Moreover, as the inner volume of the loudspeaker box is constant, it is impossible to change the sound effect as desired.

SUMMARY OF THE INVENTION

Accordingly, it is an object of this invention to provide an improved structure for mounting a loudspeaker, reducing the space for the mounting apparatus and changing the sound effect as desired.

According to this invention, there is provided a structure for mounting a loudspeaker on an electronic musical instrument comprising a casing of the musical instrument having a loudspeaker accommodating space, and a hollow pliable member with one opening secured to the bottom surface of the space, the loudspeaker being mounted to close the other opening of the hollow pliable member.

DESCRIPTION OF THE PREFERRED EMBODIMENTS

Figure 1:
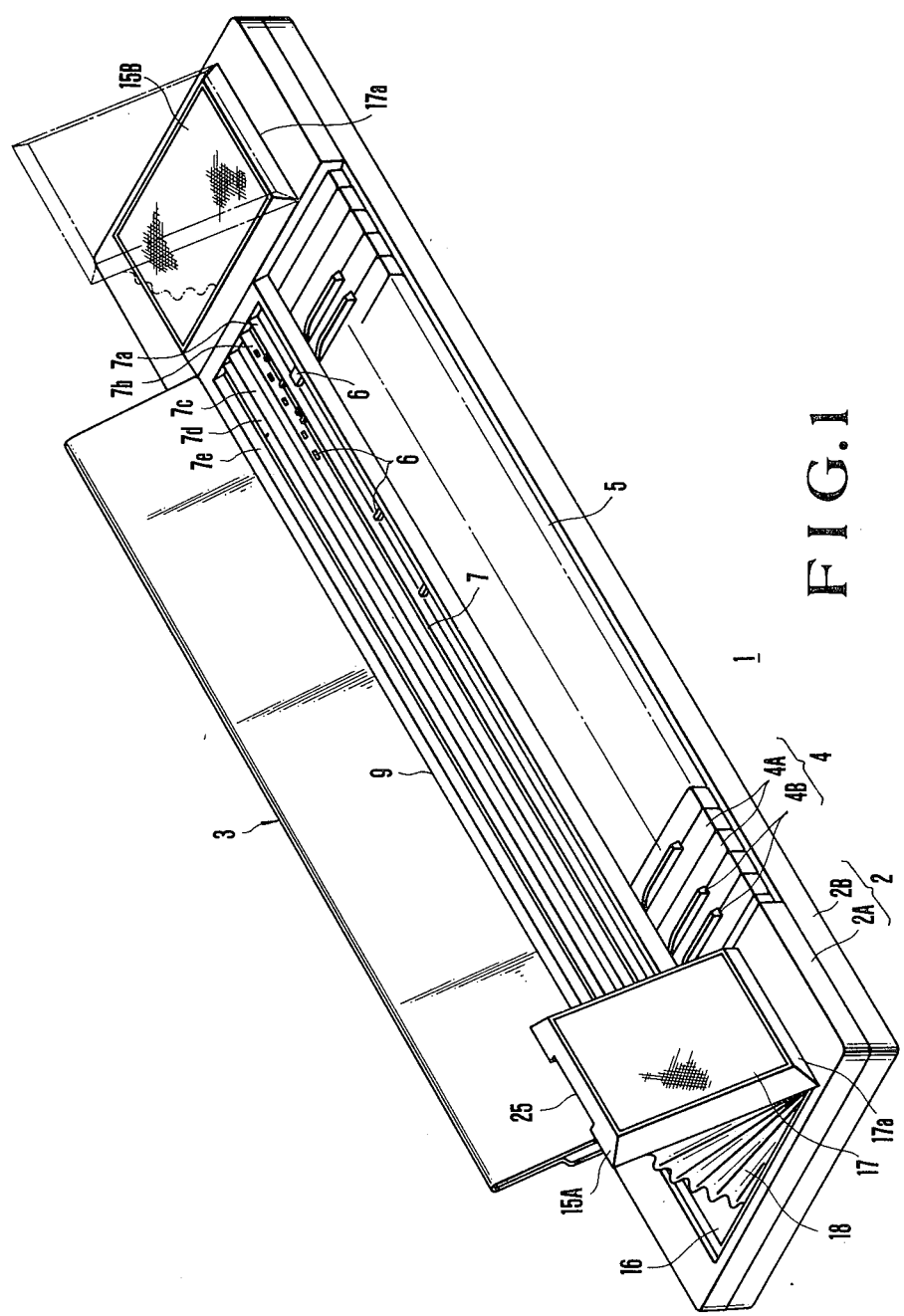
FIG. 1 is a perspective view of one example of an electronic musical instrument with its lid opened and incorporated with the structure for mounting a loudspeaker according to this invention.
Figure 2:
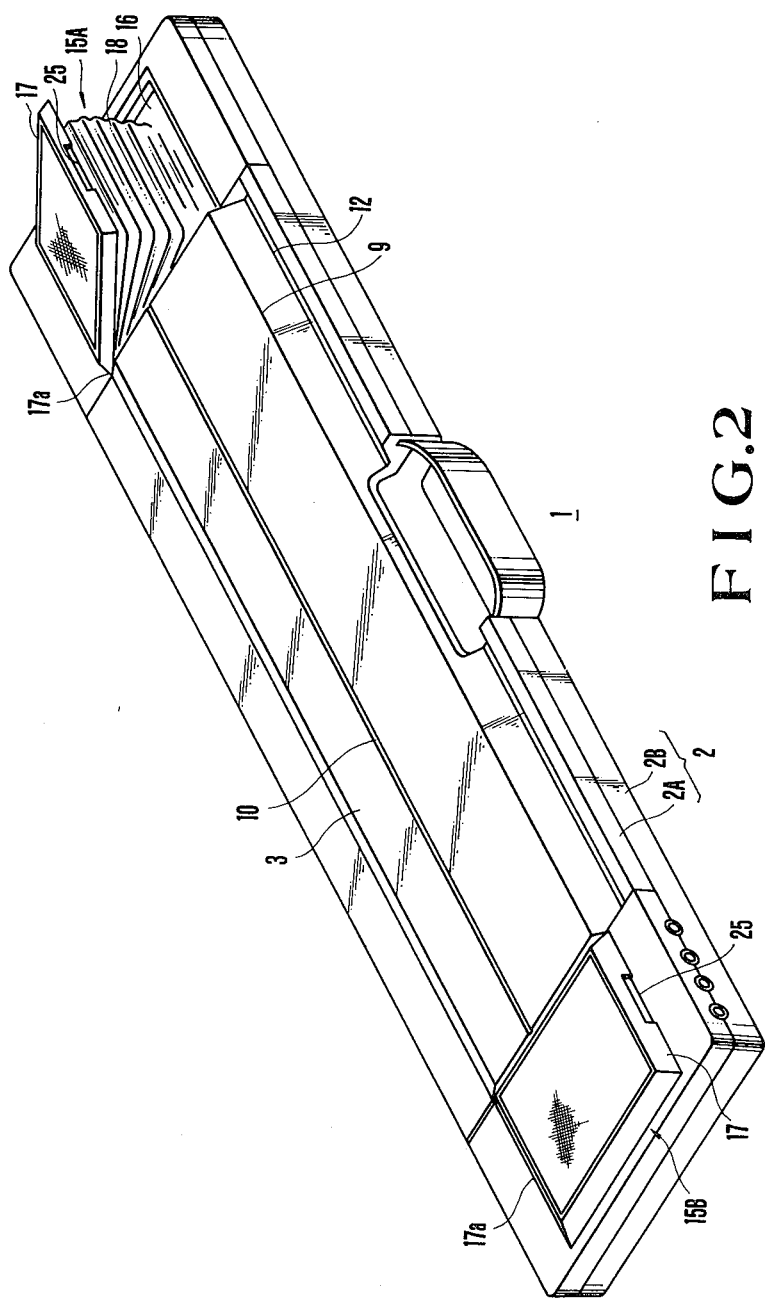
FIG. 2 is a rear perspective view of the musical instrument with the lid closed.

Referring now to FIGS. 1 and 2, an electronic keyboard musical instrument generally designated by a reference numeral 1 comprises a body 2 of an elongated shallow box form formed by integrally combining an upper casing 2A and a lower casing 2B and a lid or cover 3, the lid 3 and the body 2 forming the casing of the musical instrument.

The central portion of the body 2 is open, and a keyboard 4 comprising a plurality of natural keys 4A and sharp keys 4B is disposed, particularly at the front side of the body 2 opened portion to form a keyboard unit 5. An operating panel 7 is disposed to the rear side of the keyboard unit 5. On the operating panel 7 are mounted a plurality of electric component elements 6 including a tone selection switch selecting tones of an organ, a harpsichord, a piano or the like, a volume adjusting variable resistor, etc. A plurality of inclined surfaces 7a through 7e having the same angle of inclination are provided for the operating panel 7 with proper spacings between the inclined surfaces. On these inclined surfaces 7a through 7e, are mounted the electric component elements display characters, symbols and the like to assist operation and visual confirmation.

Figure 3:
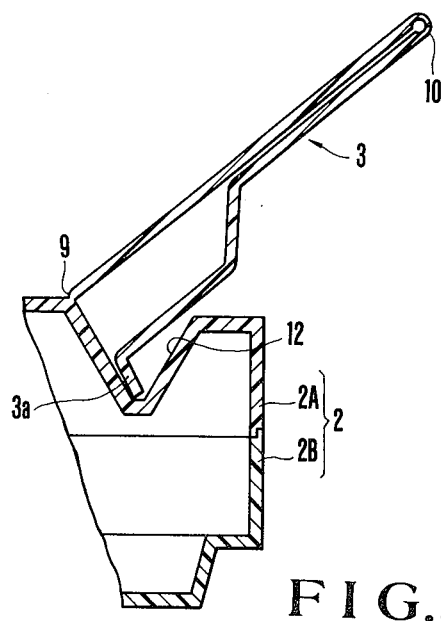
FIG. 3 is an enlarged sectional view showing an anchoring structure of the lid.

The lid 3 is formed intergral with the upper casing 2A and adapted to cover and protect the operating panel 7 and the keyboard unit 5 when the lid 3 is closed. As shown in FIG. 3, the rear end of the lid 3 is integrally connected to the rear end of the upper surface of the upper casing 2a by a synthetic bendable thin hinge 9. The portion of the lid 3 adjoining a junction between the keyboard unit 5 and the operating panel 7 is made thin to form a hinge 10 so that at the time of performance, the lid 3 is folded back on itself with its inner surface faced outward.

A letter V shaped anchoring groove 12 which anchors the fore end 3a of the lid 3 is formed at the upper rear end of the body 2 of the musical instrument along the lid. In the anchored state, the folded lid 3 is held at substantially the same inclination angle as those of the inclined surfaces 7a through 7e of the operating panel 7 thereby preventing the lid 3 from depending downwardly at the rear side of the body 2. The arrangement of the lid and the anchoring groove therefor does not constitute a part of my invention but is described by way of explanation of the embodiment.

The body 2 of the musical instrument contains therein a plurality of key switches corresponding to respective keys 2A and 2B, a musical tone forming circuit, a control circuit, connecting wires and other various electrical component parts (all not shown). When a key is depressed a key switch corresponding thereto is operated to electrically form a predetermined musical tone which is produced by a pair of loudspeakers 15A and 15B. These loudspeakers 15A and 15B are disposed in a loudspeaker accomodating space 16 at both ends of the upper surface of the body 2 to be pulled out and pushed in as desired.

Each of the loudspeaker 15A and 15B is fixed to the central portion of the rear surface of a surface plate 17 having a net or grid cover, the surface plate 17 being connected with a bellows 18 to close its upper opening. When each of the loudspeaker 15A and 15B is accommodated or pushed in, the loudspeaker accommodating space 16 is reduced and then closed as the surface plate is moved downwardly. As shown in FIG. 4 the lower opening of the bellows 18 is secured to the inner bottom surface 16a of the loudspeaker accommodating space 16.

Figure 4A:
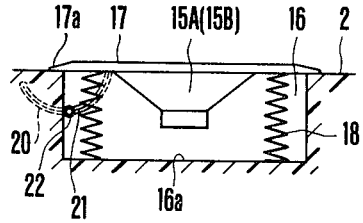
FIGS. 4a and 4b show pushed in and pulled out states of the loudspeaker reaspectively.
Figure 4B:
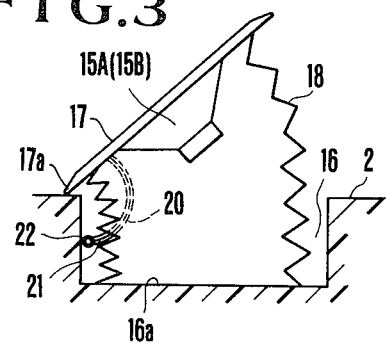

As shown in FIGS. 4a and 4b, each loudspeaker is provided with semicircular curved arms 20 with one end secured to the front end of the rear surface of the surface plate 17. Each arm 20 is formed with a curved groove extending therealong to receive guide pins 22 provided for the inner wall of the front side of the loudspeaker accommodating spacing 16. As a consequence, when the loudspeakers 15A and 15B are received in or pulled out of the loudspeaker accommodating spaces 16 by expanding and contracting the bellows 18, the loudspeakers can tilted forwardly and rearwardly about pivot points provided by the fore edge 17a of the surface plate 17 by the cooperation of the curved arms 20 and the guide pins 22. Thus, the loudspeakers can be held at any desired angular position within a given range of angles, for example 90°. Such angle setting can be accomplished by the friction between the curved arms 20 and the guide pins 22 or a suitable click mechanism.

Loudspeaker 15A and 15B received in the loudspeaker accommodating spaces 16 can be pulled out by engaging fingers against recesses 25 (see FIGS. 1 and 2). Instead of manual operation, the loudspeakers can be automatically pulled out or pushed in by an electric motor, a solenoid coil or the like.

According to this invention, since it is possible to pull out and push in the loudspeakers in the body 2 of the electric musical instrument it is possible to make compact the electronic musical instrument just in the same manner as in the prior art electronic musical instrument which contains the loudspeakers in the body thereof. Accordingly, the electronic musical instrument embodying the invention is easy to transport. Moreover, since the bellows 18 are compressed at the time of pushing in the loudspeakers, the loudspeaker accommodating spaces 16 may be shallow, thus making thin the body 2. When the loudspeakers 15A and 15B are pulled out the sound generated thereby would be confined in the body 2. Moreover, when the bellows are expanded, the volume of the spaces behind the loudspeakers are increased to improve the quantity of the sound. As the angles of inclination of the loudspeakers can be adjusted the spaces behind the loudspeakers can also be adjusted as desired to obtain an optimum acoustic characteristic.

Figure 5:
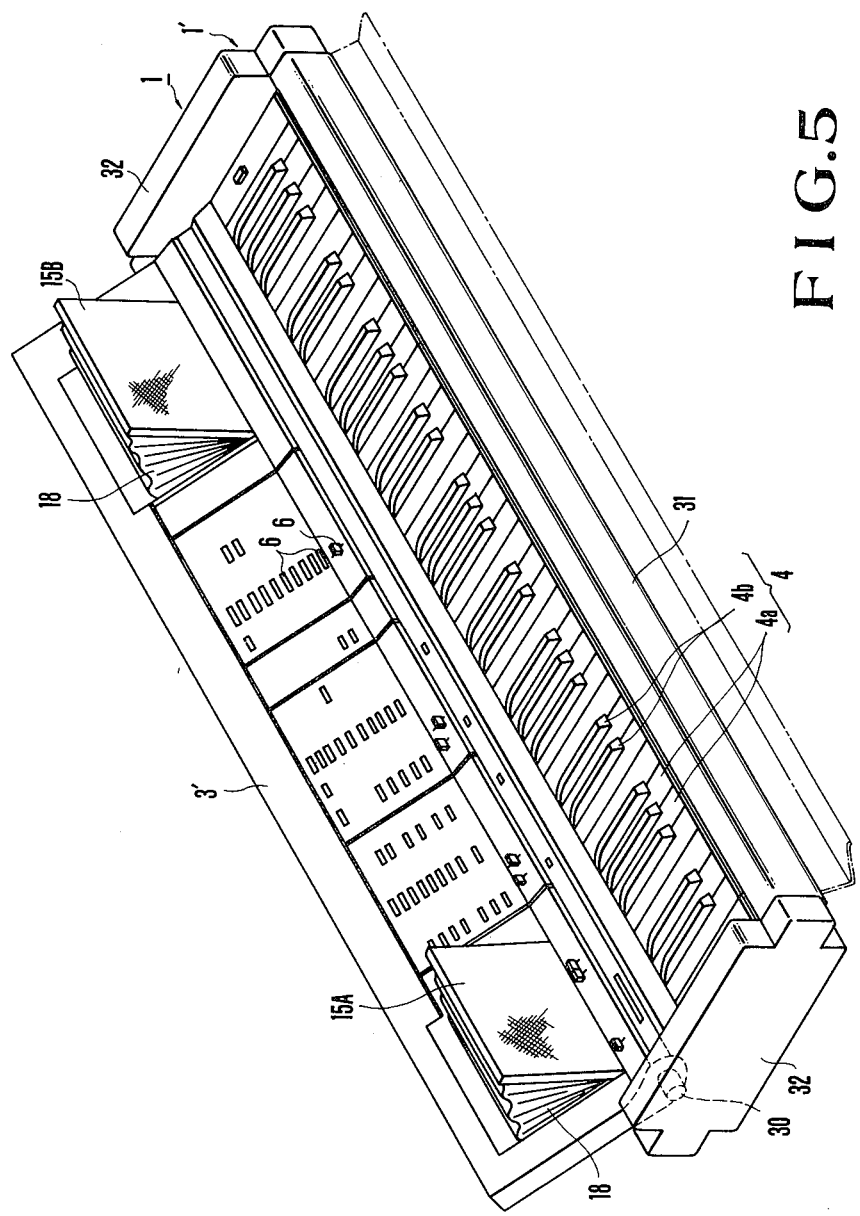
FIG. 5 is a perspective view showing a modified embodiment of this invention.

FIG. 5 shows a modified embodiment of this invention, in which the electronic keyboard musical instrument 1 is divided into a lid 3' and a keyboard unit 1'. The lid 3' is provided with the performance of an operating panel and rotatable about a pivot shaft 30 with respect to the keyboard unit 1'. Loudspeakers 15A and 15B having bellows 18 are secured to predetermined positions of the lid 3'. Reference numeral 31 designates a rotatable front cover and its rotated position is shown by dot and dash lines. A member designated by numeral 32 shows side plates. Other portions corresponding to those shown in FIGS. 1 to 4 are designated by the same reference characters.

With this modification too it is possible to make thin the musical instrument and to improve the acoustic effect.

Figure 6:
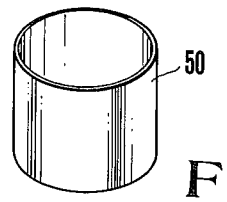
FIG. 6 is a perspective view showing another embodiment of the pliable member.

In this specification, the bellows can include a hollow cylindrical pliable member 50 made of paper, vinyl chloride or an elastomer as shown in FIG. 6. The base portion of the loudspeaker can be constructed by a synthetic bendable hinge same as the hinge portion 9 shown in FIG. 3.

What is claimed is:

1. A compactable and adjustable structure for mounting a speaker in an electronic musical instrument having a speaker accommodating space comprising:
    a bellows shaped hollow pliable member with first and second ends, said first end being adapted to allow mounting to a speaker, said second end being adapted to allow mounting to a surface, said hollow pliable member facilitating movement from a first position, in which said speaker and said hollow pliable member is wholly confined within said speaker accommodating space, to a plurality of second positions in which said speaker and said hollow pliable member project at least partially beyond the confines of said speaker accommodating space, movement from said first position to said plurality of second positions allowing adjustment of the volume of air behind the speaker and within the hollow pliable member to obtain an optimum acoustic characteristic.

2. A compactable and adjustable structure for mounting a speaker as claimed in claim 1, in which said hollow pliable member is cylindrical.

3. A compactable and adjustable structure for mounting a speaker as claimed in claim 1, in which said first end is additionally adapted to allow mounting to a surface plate.

4. A compactable and adjustable structure for mounting a speaker as claimed in claim 1, additionally comprising movement control means to control the angular direction and limitation of projection as movement is effected between said first position and said plurality of second positions.

5. A compactable and adjustable structure for mounting a speaker as claimed in claim 4, in which said movement control means comprises a hinge attached at said first end of said hollow pliable member.

6. A compactable and adjustable structure for mounting a speaker as claimed in claim 4, in which said movement control means comprises at least one guide pin attached to said walls defining said speaker accommodating space; at least one semicircular curved arm attached at said first end of said hollow pliable member, said at least one semicircular curved arm being formed with a curved groove to receive and work in conjunction with said at least one guide pin.

7. A compactable and adjustable structure for mounting a speaker as claimed in claim 4, in which said movement control means additionally comprises holding means for holding said speaker and said hollow pliable member in any desired said plurality of second positions.

8. A compactable and adjustable structure for mounting a speaker as claimed in claim 7, in which said holding means comprises a clicking mechanism.

* * * * *